United States Patent
Hwang et al.

(10) Patent No.: US 9,166,099 B2
(45) Date of Patent: Oct. 20, 2015

(54) GRAPHENE LIGHT-EMITTING DEVICE AND METHOD OF MANUFACTURING THE SAME

(75) Inventors: Sung-won Hwang, Suwon-si (KR); Geun-woo Ko, Suwon-si (KR); Sung-hyun Sim, Seoul (KR); Hun-jae Chung, Suwon-si (KR); Han-kyu Seong, Seoul (KR); Cheol-soo Sone, Seoul (KR); Jin-hyun Lee, Suwon-si (KR); Hyung-duk Ko, Seoul (KR); Suk-ho Choi, Suwon-si (KR); Sung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 915 days.

(21) Appl. No.: 13/234,739

(22) Filed: Sep. 16, 2011

(65) Prior Publication Data
US 2012/0068152 A1    Mar. 22, 2012

(30) Foreign Application Priority Data

Sep. 16, 2010  (KR) .......... 10-2010-0091259
Sep. 14, 2011  (KR) .......... 10-2011-0092511

(51) Int. Cl.
| H01L 29/06 | (2006.01) |
| H01L 33/06 | (2010.01) |
| H01L 29/786 | (2006.01) |
| H01L 33/34 | (2010.01) |
| H01L 51/00 | (2006.01) |

(52) U.S. Cl.
CPC .......... *H01L 33/06* (2013.01); *H01L 29/78684* (2013.01); *H01L 33/34* (2013.01); *H01L 51/0046* (2013.01)

(58) Field of Classification Search
CPC .............. H01L 33/04; H01L 29/66015; H01L 2924/13088; H01L 29/78684; H01L 33/34; H01L 33/06; H01L 51/0046
USPC .................. 257/9, 13; 977/733, 734
See application file for complete search history.

(56) References Cited

U.S. PATENT DOCUMENTS

| 6,346,436 B1 | 2/2002 | Fukushima et al. |
| 8,476,739 B2 | 7/2013 | Okai et al. |
| 2008/0042153 A1* | 2/2008 | Beeson et al. .......... 257/94 |

(Continued)

FOREIGN PATENT DOCUMENTS

| JP | 2000223690 A | 8/2000 |
| JP | 2009182173 A | 8/2009 |

(Continued)

OTHER PUBLICATIONS

Sevincli, H. Superlattice structures of graphene-based armchair nanoribbons. Physical Review B 78, 245402 (2008).*

(Continued)

*Primary Examiner* — Matthew Landau
*Assistant Examiner* — Eric Ashbahian
(74) *Attorney, Agent, or Firm* — Sughrue Mion, PLLC

(57) ABSTRACT

A graphene light-emitting device and a method of manufacturing the same are provided. The graphene light-emitting device includes a p-type graphene doped with a p-type dopant; an n-type graphene doped with an n-type dopant; and an active graphene that is disposed between the type graphene and the n-type graphene and emits light, wherein the p-type graphene, the n-type graphene, and the active graphene are horizontally disposed.

25 Claims, 18 Drawing Sheets

(56) References Cited

U.S. PATENT DOCUMENTS

| | | |
|---|---|---|
| 2009/0221130 A1 | 9/2009 | Asano |
| 2010/0055464 A1 | 3/2010 | Sung |
| 2011/0186817 A1* | 8/2011 | Bowers et al. .................. 257/29 |
| 2011/0253969 A1* | 10/2011 | Dai et al. ........................... 257/9 |
| 2014/0338962 A1 | 11/2014 | Sung |

FOREIGN PATENT DOCUMENTS

| | | | |
|---|---|---|---|
| JP | 2010-021377 A | 1/2010 | |
| JP | 2010153793 A | 7/2010 | |
| KR | 10-2009-0003526 | * 1/2009 | ............. H01L 33/00 |
| KR | 10-2009-0003526 A | 1/2009 | |
| KR | 10-2010-0001062 A | 1/2010 | |
| TW | 201022142 A1 | 6/2010 | |
| WO | 2008108383 A1 | 9/2008 | |

OTHER PUBLICATIONS

Luo et al. Photoluminescence and band gap modulation in graphene oxide. Applied Physics Letter 94, 111909 (2009).*

Shi et al. Work Function Engineering of Graphene Electrode via Chemical Doping. American Chemical Society vol. 4, No. 5, pp. 2689-2694 (2010).*

Wang et al. Nitrogen-Doped Graphene and Its Application in Electrochemical Biosensing. American Chemical Society vol. 4, No. 4, pp. 1790-1798 (2010).*

Gunlycke et al. Altering low-bias transport in zigzag-edge graphene nanostrips with edge chemistry. Applied Physics Letters 91, 112108 (2007).*

Zhengtang Luo, et al., "Photoluminescence and Band Gap Modulation in Graphene Oxide", Applied Physics Letters, vol. 94, 2009, pp. 111909-1-111909-3.

Qingsong Mei, "Highly Efficient Photoluminescent Graphene Oxide with Tunable Surface Properties", The Royal Society of Chemistry, 2010, pp. 1-6.

Communication issued on Mar. 2, 2015 by the State Intellectual Property Office of PR of China in related application No. 201110276450.X.

Communication issued on May 26, 2015 by the Japanese Patent Office in related Application No. 2011202388.

* cited by examiner

GRAPHENE LIGHT-EMITTING DEVICE AND METHOD OF MANUFACTURING THE SAME

CROSS-REFERENCE TO RELATED APPLICATIONS

This application claims the benefit of Korean Patent Application No. 10-2010-0091259, filed on Sep. 16, 2010 and 10-2011-0092511, filed on Sep. 14, 2011 in the Korean Intellectual Property Office, the disclosures of which are incorporated herein in their entirety by reference.

BACKGROUND

1. Field

The present disclosure relates to light-emitting devices and methods of manufacturing the same, and more particularly, to light-emitting devices using graphene and methods of manufacturing the same.

2. Description of the Related Art

Graphene refers to a two-dimensional (2D) thin film having a bee hive shaped structure that consists of a one-carbon-thickness of single layer. Carbon atoms are chemically bonded to each other by a $sp^2$ hybrid orbital to form a 2D carbon hexagonal net plane. An assembly of the carbon atoms having the planar structure is graphene, and a thickness thereof is as small as 0.3 nm equivalent to one carbon atom.

As a method of preparing graphene, mechanical exfoliation, chemical exfoliation, heat treatment of SiC, chemical vapor deposition, epitaxial synthesis, organic synthesis, etc. may be used. Furthermore, lithography may also be used to micro-pattern graphene.

Due to very different characteristics of graphene from existing materials, studies for applying graphene into electronic devices are being actively performed.

SUMMARY

Semiconductor light-emitting devices, such as a light emitting diode (LED) or a laser diode (LD), operates based on an electro-photoluminescence phenomenon in which light is emitted from a material (semiconductor) by application of a current or voltage, and are formed based on a compound semiconductor. One or more embodiments of the present invention provide a light-emitting device using graphene as an alternative to a light-emitting device based on a compound semiconductor and a method of manufacturing the same.

Additional aspects will be set forth in part in the description which follows and, in part, will be apparent from the description, or may be learned by practice of the presented embodiments.

According to an aspect of the present invention, a graphene light-emitting device includes: a p-type graphene doped with a p-type dopant; an n-type graphene doped with an n-type dopant; and an active graphene that is disposed between the type graphene and the n-type graphene and emits light, wherein the p-type graphene, the n-type graphene, and the active graphene are horizontally disposed.

The active graphene may include a graphene superlattice. The graphene superlattice may have a multiple quantum well potential.

The graphene superlattice may include at least one graphene nanoribbon having a band shape connecting the p-type graphene to the n-type graphene. At least one of opposite edges of the at least one graphene nanoribbon may have a zigzag shape. In this case, a width of each of the at least one graphene nanoribbon periodically changes within a range of about 3 nm to about 20 nm. Also, an interval between adjacent nanoribbons of the at least one graphene nanoribbon is in a range of about 2 nm to about 15 nm.

The graphene superlattice may include at least one graphene nanoribbon that extends parallel to boundaries of the p-type graphene and the n-type graphene between the p-type graphene and the n-type graphene. At least one of opposite edges of the at least one graphene nanoribbon has a zigzag shape.

The graphene superlattice may have periodically arranged quantum dot patterns.

The active graphene may further include a plurality of graphene quantum dots dispersed between the type graphene and the n-type graphene. In this case, a first region in which the graphene superlattice is disposed and a second region in which a plurality of graphene quantum dots are disposed may do not overlap. A first region in which the graphene superlattice is disposed and a second region in which a plurality of graphene quantum dots may be alternately arranged. A first region in which the graphene superlattice is disposed and a second region in which a plurality of graphene quantum dots are disposed may overlap.

The active graphene may include a plurality of graphene quantum dots dispersed between the p-type graphene and the n-type graphene.

The graphene quantum dots may have substantially the same size. Alternatively, the graphene quantum dots may have at least two different sizes. In this case, the graphene quantum dots may have three different sizes respectively corresponding to a red photoluminescence, a green photoluminescence, and a blue photoluminescence.

The graphene quantum dots may have substantially the same shape. Alternatively, the graphene quantum dots may have at least two different shapes.

The active graphene may be functionalized by attaching a functional group to a surface or edge of the graphene. In this case, the functional group may be alkylamine, aniline, methylene blue, an amine-based polymer, or any known functional group.

The p-type graphene, the n-type graphene, and the active graphene may be supported by a substrate.

The p-type dopant may be at least one element selected from the group consisting of oxygen (O), gold (Au), and bismuth (Bi); at least one compound selected from the group consisting of $CH_3NO_2$, $HNO_3$, $HAuCl_4$, $H_2SO_4$, HCl, and $AuCl_3$; or a mixture thereof. In this regard, the p-type dopant may be doped at a concentration of about $1\times10^{-20}$ $cm^{-2}$ to about $1\times10^{-5}$ $cm^{-2}$.

The n-type dopant may be at least one element selected from the group consisting of nitrogen (N), fluorine (F), and manganese (Mn); $NH_3$; or a mixture thereof. The p-type graphene may be horizontally spaced from the n-type graphene. In this regard, the n-type dopant may be doped at a concentration of about $1\times10^{-20}$ $cm^{-2}$ to about $1\times10^{-5}$ $cm^{-2}$.

The p-type graphene and the n-type graphene may be spaced from each other horizontally at a constant distance.

According to another aspect of the present invention, a method of manufacturing a graphene light-emitting device includes: preparing graphene; doping a p-type dopant on a first region of the graphene to form a p-type graphene; doping an n-type dopant on a second region of the graphene spaced apart from the first region to form an n-type graphene; and forming an active graphene in a region between the p-type graphene and the n-type graphene of graphene. The forming of the p-type graphene, the forming of the n-type graphene, and the forming of the active graphene may be switched.

The forming of the active graphene may include patterning the graphene to form a graphene superlattice. For example, the forming of the active graphene may include patterning the graphene to form at least one graphene nanoribbon having a band shape connecting the p-type graphene to the n-type graphene. At least one of opposite edges of the at least one graphene nanoribbon may have a zigzag shape. In this case, a width of each of the at least one graphene nanoribbon periodically changes within a range of about 3 nm to about 20 nm. Also, an interval between adjacent nanoribbons of the at least one graphene nanoribbon may be in a range of about 2 nm to about 15 nm. Alternatively, the forming of the active graphene may include patterning the graphene to form at least one graphene nanoribbon that that extends parallel to boundaries of the p-type graphene and the n-type graphene between the p-type graphene and the n-type graphene. In this regard, at least one of opposite edges of the at least one graphene nanoribbon may have a zigzag shape.

The forming of the active graphene may include patterning the graphene to form periodically arranged quantum dot patterns.

The forming of the active graphene may further include applying graphene quantum dots.

The forming of the active graphene may further include applying graphene quantum dots without the formation of the graphene superlattice.

The graphene quantum dots may have substantially the same size. Alternatively, the graphene quantum dots may have at least two different sizes. In the latter case, the graphene quantum dots may include three different sizes respectively corresponding to a red photoluminescence, a green photoluminescence, and a blue photoluminescence.

The graphene quantum dots may have substantially the same shape. Alternatively, the graphene quantum dots may have at least two different shapes.

The forming of the active graphene may further include attaching a functional group to a surface or edge of the active graphene. In this regard, the functional group is alkylamine, aniline, methylene blue, an amine-based polymer, or any other known functional group.

The attaching the functional group to the active graphene may include: oxidizing the active graphene; reacting a carboxyl group of an active graphene oxide and an amine group of the functional group to attach the functional group to the active graphene oxide; and reducing the active graphene oxide to which the functional group is attached.

The p-type dopant may be at least one element selected from the group consisting of oxygen (O), gold (Au), and bismuth (Bi); at least one compound selected from the group consisting of $CH_3NO_2$, $HNO_3$, $HAuCl_4$, $H_2SO_4$, HCl, and $AuCl_3$; or a mixture thereof, and the n-type dopant is at least one element selected from the group consisting of nitrogen (N), fluorine, (F), and manganese (Mn); $NH_3$; or a mixture thereof.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
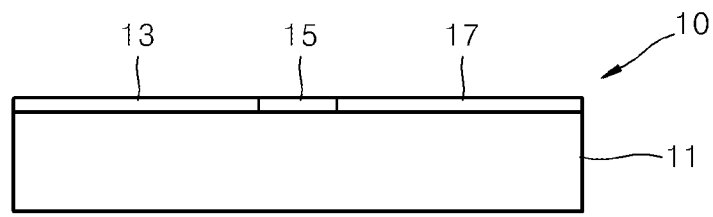
FIG. 1 is a side view of a graphene light-emitting device according to an embodiment of the present invention.

Reference will now be made in detail to embodiments, examples of which are illustrated in the accompanying drawings, wherein like reference numerals refer to the like elements throughout and sizes or thicknesses of the respective elements may be enlarged for clarity. In this regard, the present embodiments may have different forms and should not be construed as being limited to the descriptions set forth herein. Accordingly, the embodiments are merely described below, by referring to the figures, to explain aspects of the present description The term "graphene" used herein refers to a two-dimensional thin film formed of a polycyclic aromatic molecule having a two-dimensional carbon hexagonal net plane that is, a bee hive structure formed by covalently bonding a plurality of carbon atoms, and the covalently bonded carbon atoms may form a 6-membered cycle as a repeating unit. However, a 5-membered cycle and/or a 7-membered cycle may be further included. Accordingly, the graphene is viewed as a single layer of covalently bonded carbon atoms (sp² hybridization). The graphene may have various structures according to amounts of the 5-membered cycle and/or 7-membered cycle included in graphene. The graphene may consist of only a single layer. However, in the present specification, the graphene may also consist of a plurality of graphene single layers stacked on each other.

Figure 2:
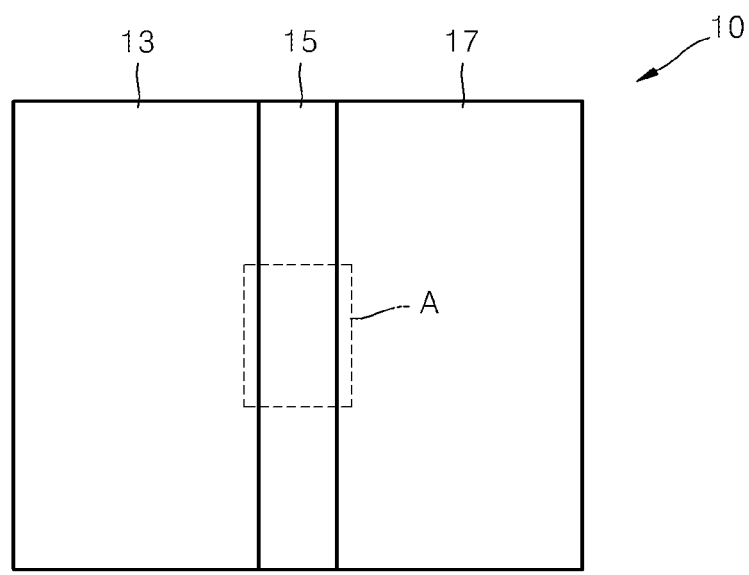
FIG. 2 is a plan view of the graphene light-emitting device of FIG. 1.
Figure 3:
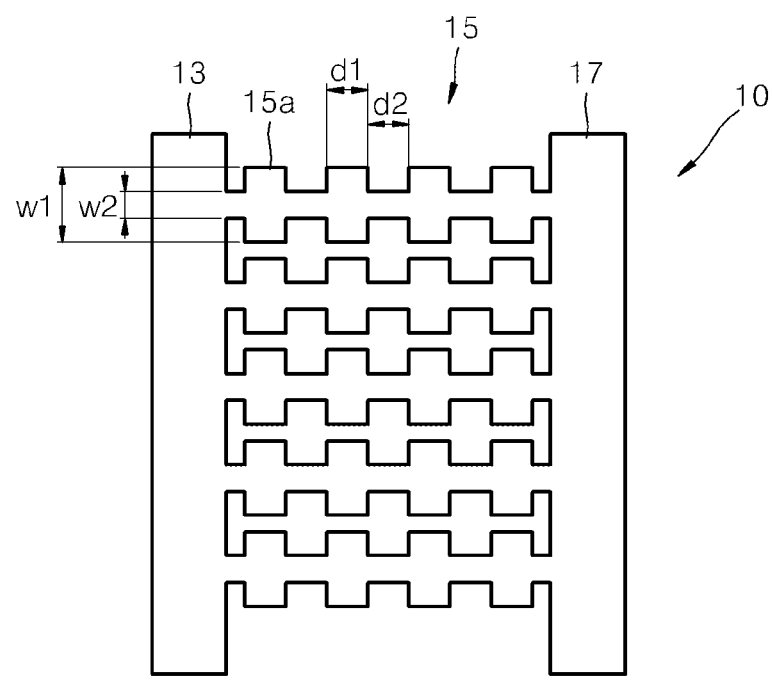
FIG. 3 is an enlarged view of a region A of FIG. 2 as an example of a graphene superlattice of an active graphene.

FIG. 1 is a side view of a graphene light-emitting device 10 according to an embodiment of the present invention, FIG. 2 is a plan view of the graphene light-emitting device 10 of FIG. 1, and FIG. 3 is an enlarged view of a region A of FIG. 2 as an example of a graphene superlattice of an active graphene 15.

Referring to FIGS. 1 and 2, the graphene light-emitting device 10 includes a p-type graphene 13, an active graphene 15, and an n-type graphene 17 which are flush with each other and horizontally disposed on a substrate 11.

The substrate 11 may support the p-type graphene 13, the active graphene 15, and the n-type graphene 17, and may be formed of a non-conductive material. Graphene is known as a material having a physical strength of 1,100 GPa that is 200 or more times greater than that of steel. Accordingly, in the present embodiment, the p-type graphene 13, the active graphene 15, and the n-type graphene 17 are sufficient to sustain their structures. In this respect, the substrate 11 is removable.

The p-type graphene 13 is a graphene doped with a p-type dopant. The p-type dopant may include: at least one element selected from the group consisting of oxygen (O), gold (Au), and bismuth (Bi); at least one compound selected from the group consisting of $CH_3NO_2$, $HNO_3$, $HAuCl_4$, $H_2SO_4$, HCl, and $AuCl_3$; or a mixture thereof. In this case, the p-type dopant may be doped at a concentration of about $1\times10^{-20}$ $cm^{-2}$ to about $1\times10^{-5}$ $cm^{-2}$.

The n-type graphene 17 is a graphene doped with n-type dopant. The n-type dopant may include at least one element selected from the group consisting of nitrogen (N), fluorine (F), and manganese (Mn); $NH_3$; or a mixture thereof. The n-type dopant may be doped at a concentration of about $1\times10^{-20}$ $cm^{-2}$ to about $1\times10^{-5}$ $cm^{-2}$.

A non-doped graphene does not have an energy band gap generated due to a conduction band and a valence band. However, when the p-type dopant or the n-type dopant is doped on graphene, an energy band gap occurs. The energy band gap may be controllable according to a kind of the p-type dopant or n-type dopant, a doping concentration, etc.

The p-type graphene 13 and the n-type graphene 17 are horizontally arranged, spaced apart from each other. The expression 'horizontally arranged' means that the p-type graphene 13 and the n-type graphene 17 are substantially disposed at the same level.

In FIG. 1, the p-type graphene 13 and the n-type graphene 17 each have a rectangular shape. However, the plan shape of each of the p-type graphene 13 and the n-type graphene 17 may vary. An interconnection line (not shown) may be provided to each of the p-type graphene 13 and the n-type graphene 17. For example, an electrode pad may be provided on each of the p-type graphene 13 and the n-type graphene 17, or an electrode may be attached to an end of each of the p-type graphene 13 and the n-type graphene 17.

The active graphene 15 may include a graphene superlattice having the potential of a multiple quantum well structure.

FIG. 3 is an enlarged view of a region A of FIG. 2 as an example of a graphene superlattice of the active graphene 15.

Referring to FIG. 3, the active graphene 15 includes at least one graphene nanoribbon 15a that connects the p-type graphene 13 to the n-type graphene 17 and has a band shape.

The graphene nanoribbon 15a may have such a band shape in which in a lengthwise direction thereof, a section d1 has a width w1 and a section d2 has a width w2. That is, as illustrated in FIG. 3, opposite edges of the graphene nanoribbon 15a may each have a zigzag shape. As such, because the graphene nanoribbon 15a has the periodically changed width in the lengthwise direction, the energy potential of the graphene nanoribbon 15a may have a periodical multiple quantum well structure. In this respect, the graphene nanoribbon 15a forms a graphene superlattice like a superlattice that constitutes a multiple quantum well structure of an active layer in a typical light-emitting diode.

An operation of the graphene light-emitting device 10 according to the present embodiment will now be described in detail. When a voltage is applied to the p-type graphene 13 and the n-type graphene 17 in a forward direction, holes in the p-type graphene 13 and electrons in the n-type graphene 17 move toward the active graphene 15. As described above, the p-type graphene 13 and the n-type graphene 17 each have an energy band gap by doping with a corresponding dopant. Accordingly, the electrons and holes injected into the active graphene 15 are recombined with each other in the active graphene 15, thereby emitting a photon, that is, light corresponding to the energy band gap. In this case, the multiple quantum well potential due to the superlattice structure of the active graphene 15 may result in capturing the holes and electrons in the active graphene 15, thereby increasing the recombination efficiency of the holes and electrons. Also, because graphene has very high carrier mobility, a high level of current may be suppliable to induce high brightness emission.

Figure 4:
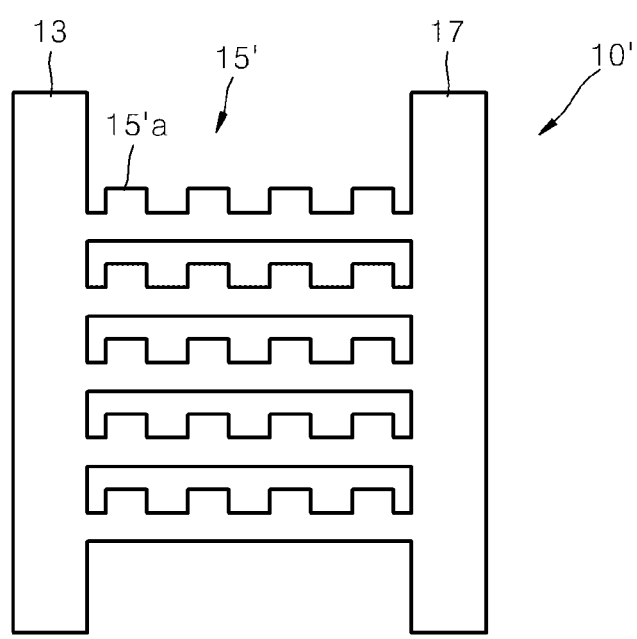
FIGS. 4 to 6 illustrate other examples of the graphene superlattice of the active graphene.
Figure 5:
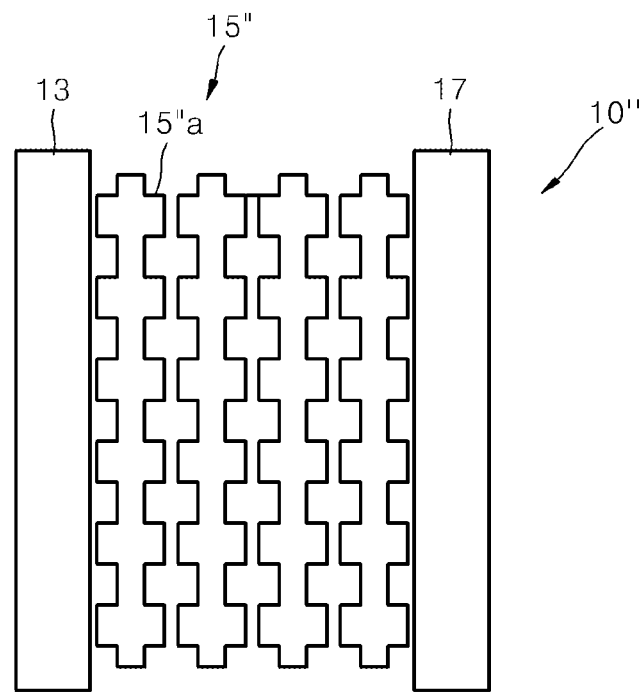
Figure 6:
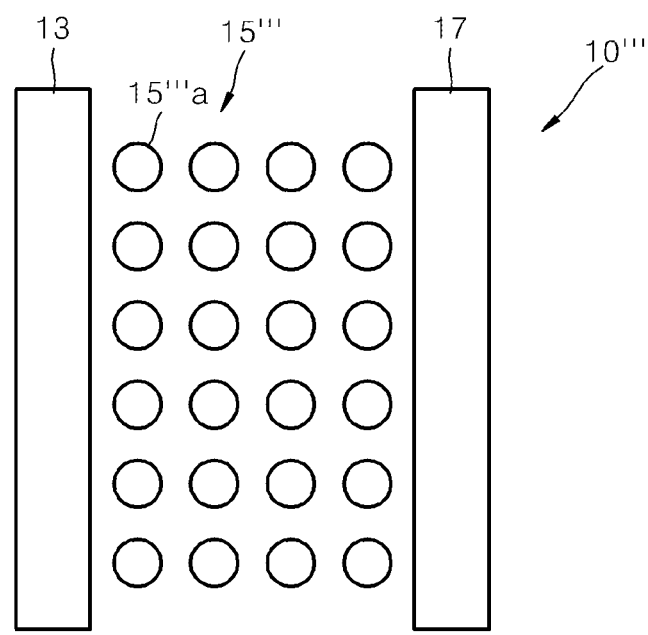

The graphene superlattice of the active graphene 15 may instead have various other structures. FIGS. 4 to 6 are enlarged images of the region A of FIG. 2, as other examples of the graphene superlattice of the active graphene 15.

Referring to FIG. 4, an active graphene 15' of a graphene light-emitting device 10' according to another embodiment of the present invention has such a band shape that at least one graphene nanoribbon 15'a connects the p-type graphene 13 to the n-type graphene 17. An edge of the graphene nanoribbon 15'a may have a zigzag shape. Due to the zigzag shape of the edge, the energy potential of the graphene nanoribbon 15'a has a periodical multiple quantum well structure and thus, it may be rendered that the graphene nanoribbon 15'a has a graphene superlattice.

Referring to FIG. 5, an active graphene 15" of a graphene light-emitting device 10" according to another embodiment of the present invention has such a band shape that at least one graphene nanoribbon 15"a extends parallel to boundaries of the p-type graphene 13 and the n-type graphene 17. At least one edge of opposite edges of the graphene nanoribbon 15"a may have a zigzag shape. Due to the zigzag shape of the edge, the energy potential of the graphene nanoribbon 15"a has a periodical multiple quantum well structure and thus, it may be rendered that the graphene nanoribbon 15"a has a graphene superlattice. In the present embodiment, the formation of the substrate (see 11 of FIG. 1) is not be omitted because the graphene nanoribbon 15"a is spaced from the p-type graphene 13 and the n-type graphene 17.

Referring to FIG. 6, an active graphene 15'" of a graphene light-emitting device 10'" according to another embodiment of the present invention includes nano-sized graphene quantum dots 15'"a regularly arranged in a region between the p-type graphene 13 and the n-type graphene 17. Because the regularly arranged graphene quantum dots 15'"a have a periodical multiple quantum well structure, it may be rendered that the graphene nanoribbon 15'"a has a graphene superlattice. Also, in the present embodiment, the formation of the substrate (see 11 of FIG. 1) is not be omitted because the graphene quantum dots 15'''a are spaced from the p-type graphene 13 and the n-type graphene 17, and the graphene quantum dots 15'''a are supported by the substrate 11. In the regard, the term 'the nano-sized' refers to a size that is equal to or greater than about 0.1 nm and equal to or smaller than about 100 nm. The graphene quantum dots 15'''a may have substantially the same size. In the previous embodiments, the active graphene 15, 15', 15'', and 15''' each having the superlattice structure have been described using pure graphene as an example. However, the active graphene 15, 15', 15'', and 15''' are not limited thereto. For example, a functional group may be attached to a surface or edge of each of the active graphene 15, 15', 15'', and 15''' to control electrical characteristics or photoluminescence characteristics of a graphene light-emitting device. As described later, when a functional group is attached to graphene, the doping characteristics or band gap of graphene are changed. Accordingly, the photoluminescence wavelength or photoluminescence characteristics (full width at half maximum) of the graphene light-emitting devices 10, 10', and 10'' may be controllable by attaching a functional group to the active graphene 15, 15', 15'', and 15'''.

FIGS. 7A to 7D are views for explaining a method of manufacturing a graphene light-emitting device, according to an embodiment of the present invention.

Figure 7A:
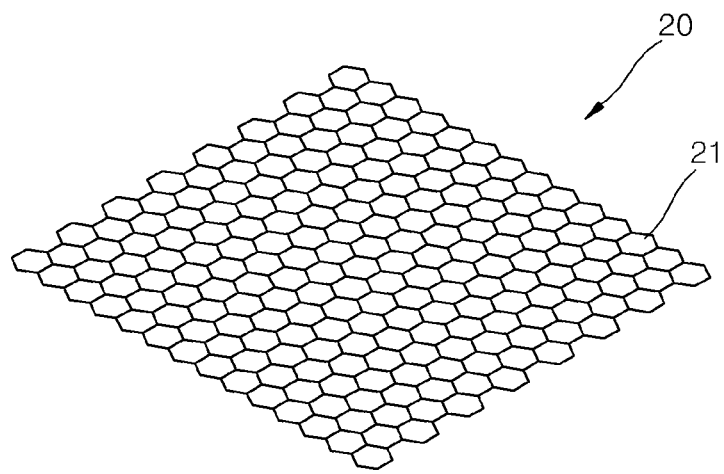
FIGS. 7A to 7D are views for explaining a method of manufacturing a graphene light-emitting device, according to an embodiment of the present invention.

Referring to FIG. 7A, first, a graphene sheet 20 is prepared. The graphene sheet 20 may be prepared by any known preparation method, such as mechanical exfoliation, chemical exfoliation, heat treatment of SiC, chemical vapor deposition, epitaxial synthesis, or organic synthesis. In FIG. 7A, a reference numeral 21 denotes a 6-membered cycle constituting a repeating unit of covalently bonded carbon atoms.

Figure 7B:
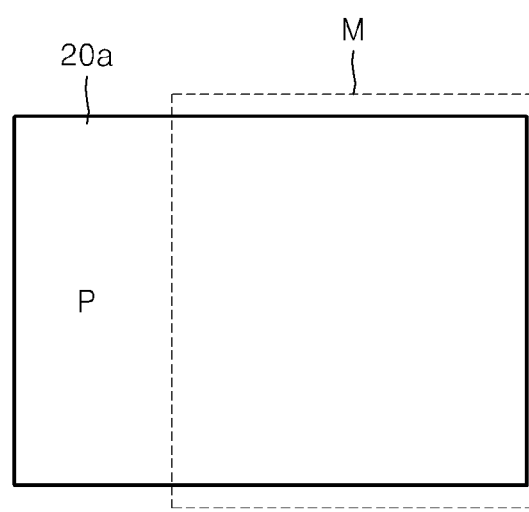

Referring to FIG. 7B, a portion of the graphene sheet 20 other than a first region 20a is selectively covered with, for example, PDMS, and the first region 20a of the graphene sheet 20 is doped with a p-type dopant to form a p-type graphene. The p-type dopant may include at least one element selected from the group consisting of oxygen (O), gold (Au), and bismuth (Bi); at least one compound selected from the group consisting of $CH_3NO_2$, $HNO_3$, $HAuCl_4$, $H_2SO_4$, HCl, and $AuCl_3$; or a mixture thereof. The p-type dopant may be doped at a concentration of about $1\times10^{-20}$ $cm^{-2}$ to about $1\times10^{-5}$ $cm^{-2}$. The doping with the p-type dopant may be performed by, for example, thermal dissociation.

Figure 7C:
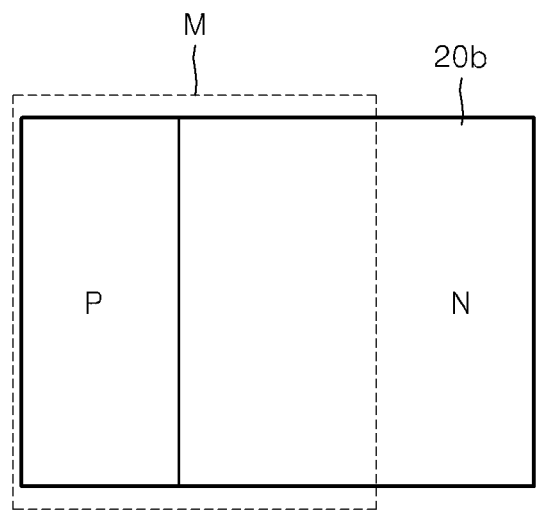

Referring to FIG. 7C, a region of the graphene sheet 20 other than the second region 20b is selectively covered with, for example, PDMS, and the second region 20b of the graphene sheet 20 is doped with an n-type dopant by, for example, thermal decomposition to form an n-type graphene. The second region 20b is spaced from the first region 20a. The n-type dopant may include at least one element selected from the group consisting of nitrogen (N), fluorine (F), and manganese (Mn); $NH_3$; or a mixture thereof. In this case, the n-type dopant may be doped at a concentration of about $1\times10^{-20}$ $cm^{-2}$ to about $1\times10^{-5}$ $cm^{-2}$.

Figure 7D:
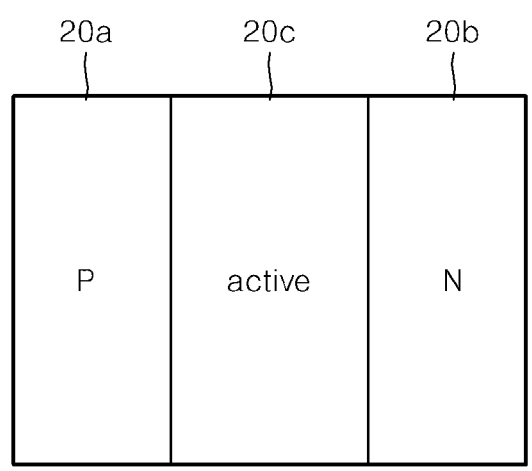

Referring to FIG. 7D, a graphene superlattice structure may be formed in a third region 20c between the first region 20a and the second region 20b of the graphene sheet 20. For example, a photo resist is spin coated on the graphene sheet 20, and the photo resist applied on the third region 20c of the graphene sheet 20 is patterned by electron beam lithography to form nanoribbons each having zigzagged-shaped edges. Then, an oxygen plasma treatment is performed thereon by reaction ion etching (RIE) to remove exposed graphene. Then, the remaining photo resist is removed using acetone, thereby completing the formation of graphene nanoribbons. Then, metal is deposited on each of the first region 20a and the second region 20b of the graphene sheet 20 to form electrodes, thereby completing the manufacture of the graphene light-emitting device.

Figure 8:
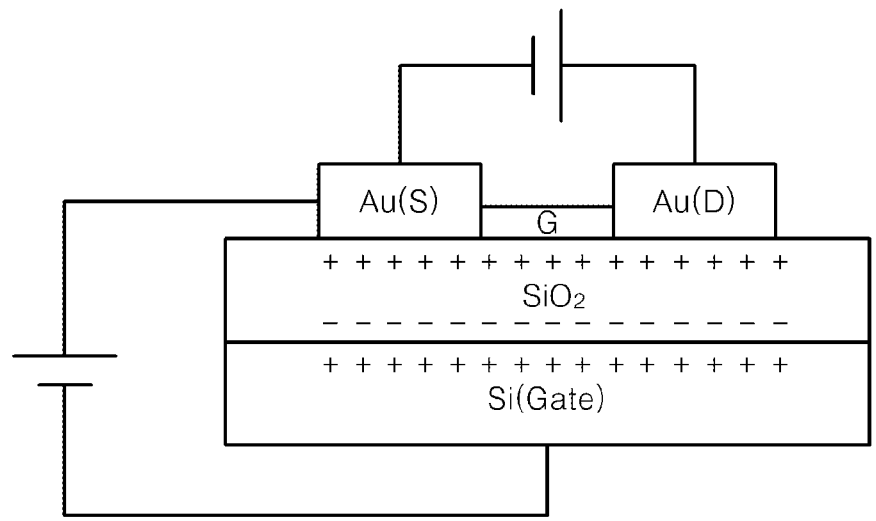
FIG. 8 is a schematic view of a graphene field effect transistor (FET) manufactured to identify electrical characteristics of a p-type graphene and an n-type graphene in a graphene light-emitting device.

FIG. 8 is a schematic view of a graphene field effect transistor (FET) manufactured to identify electrical characteristics of a p-type graphene and an n-type graphene in a graphene light-emitting device that is manufactured using the method described with reference to FIGS. 7A to 7D and FIGS. 9 and 10 show electrical characteristics of the p-type graphene and the n-type graphene.

Referring to FIG. 8, a graphene G is placed between a source electrode S and drain electrode D in a typical FET and a predetermined voltage is applied to the source electrode S and the drain electrode D and a bias voltage is applied to a gate electrode Gate. In this case, if the bias voltage applied to the gate electrode Gate is a positive (+) voltage, electrons are induced in the graphene G and thus a current flows between the source electrode S and the drain electrode D. Accordingly, if the intensity of the positive (+) bias voltage applied to the gate electrode Gate in a state in which a predetermined voltage is applied to the source electrode S and the drain electrode D increases, more electrons are induced in the graphene G and higher current may flow.

Figure 9:
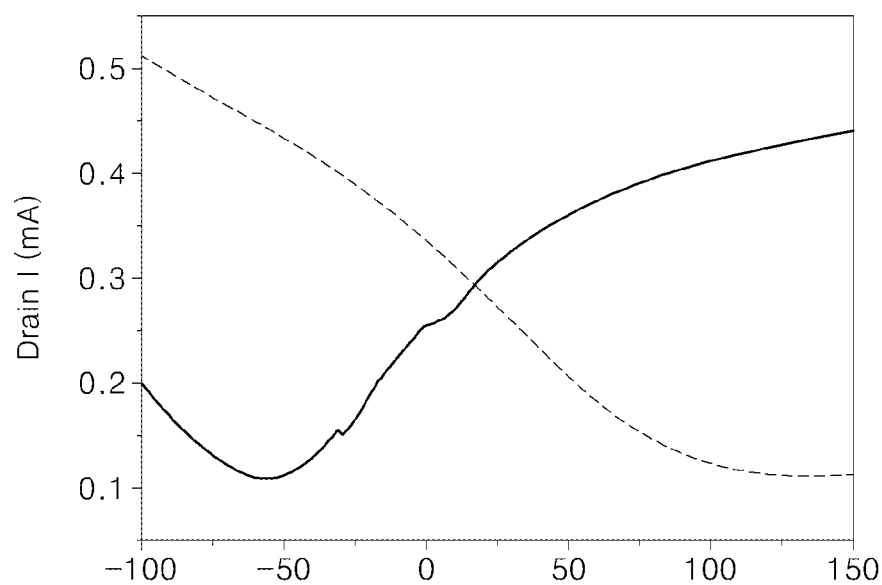
FIGS. 9 and 10 show electrical characteristics of the p-type graphene and the n-type graphene.
Figure 10:
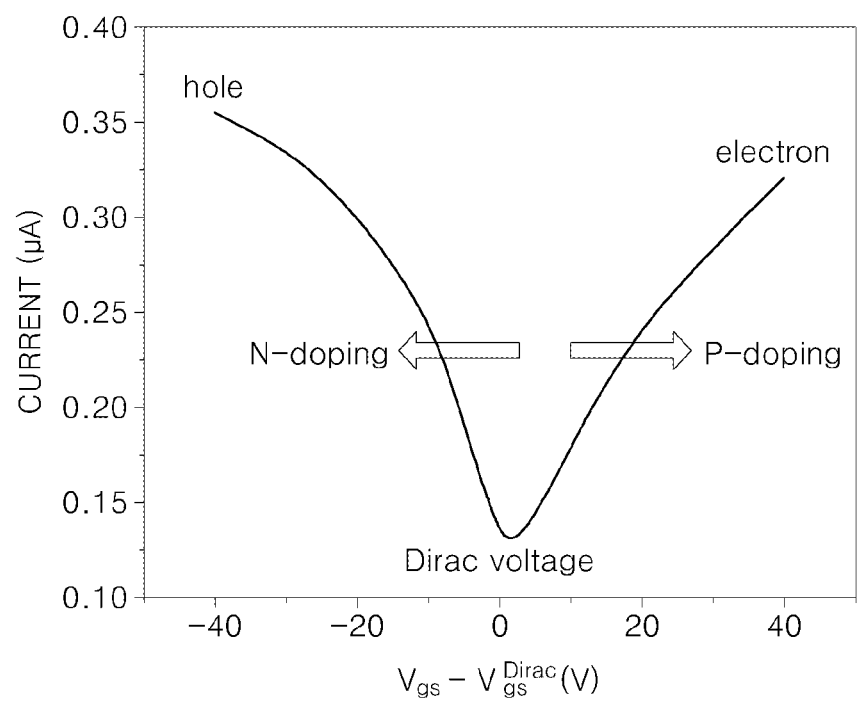

FIG. 9 shows electrical characteristics with respect to conductivity of graphene in the graphene FET and FIG. 10 is a graph for explaining electrical characteristics with respect to conductivity of graphene shown in FIG. 9. In FIG. 9, the unbroken line indicates a curve of a drain current in the n-doped graphene, and the dotted line indicates a curve of a drain current in the p-doped graphene.

In the graphene FET described above, if the graphene G is doped with an n-type dopant, the number of electrons is relatively high. Accordingly, when a positive (+) bias voltage is applied to the gate electrode Gate, electrons are generated more when the graphene G is doped with an n-type dopant than when the graphene G is not doped. Accordingly, to match the intensity of current flowing in the n-type dopant doped graphene G with the intensity of current flowing in the non-doped graphene G, a bias voltage that is applied in the case of the n-type dopant doped graphene G may be lower than a bias voltage that is applied in the case of the non-doped graphene G. That is, referring to FIGS. 9 and 10, with respect to a dirac point of the non-doped graphene G, the dirac point of the n-type dopant doped graphene G is shifted by about 50 V in a negative (−) direction. From the result, it is confirmed that the n-type dopant doped graphene G has n-type conductivity.

Likewise, if in the graphene FET, the graphene G is doped with a p-type dopant, the number of holes may be relatively high. Accordingly, electrons generated in the graphene G by applying a positive (+) bias voltage to the gate electrode Gate may be offset with the holes generated due to the p-type dopant. Accordingly, to match the intensity of a current flowing in the p-type dopant doped graphene G with the intensity of a current flowing in the non-doped graphene G, a bias voltage that is applied in the case of the p-type dopant doped graphene G may be higher than a bias voltage that is applied in the case of the non-doped graphene G. That is, referring to FIGS. 9 and 10, with respect to the dirac point of the non-doped graphene G, the dirac point of the p-type dopant doped graphene G may be shifted by about 130 V in a positive (+) direction. From the result, it is confirmed that the p-type dopant doped graphene G has p-type conductivity.

Figure 11:
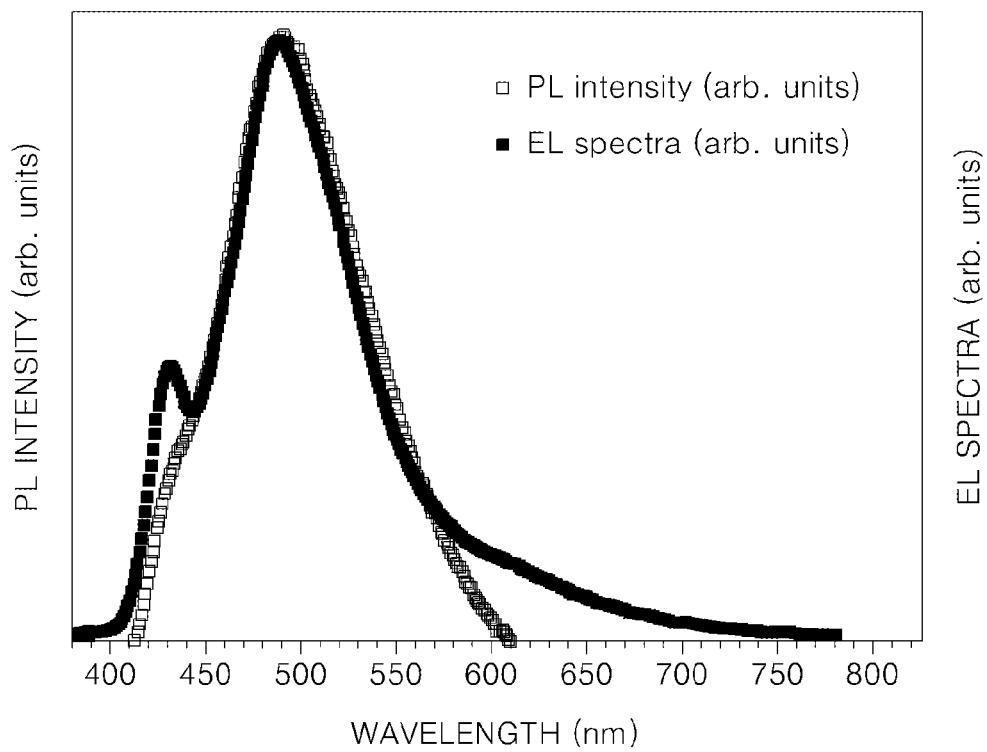
FIG. 11 shows photoluminescence characteristics of a graphene light-emitting device.

FIG. 11 shows photoluminescence characteristics of a graphene light-emitting device manufactured using the method described with reference to FIGS. 7A to 7D. In FIG.

11, a curve that consists of white spots is related to photoluminescence (PL) occurring when a laser beam is irradiated and a curve that consists of black spots is related to electroluminescence (EL) occurring when a voltage is applied. The PL curve and the EL curve of FIG. 11 show that light is emitted both when a laser beam is irradiated to an active graphene (15 of FIG. 1) according to the present embodiment and when a voltage is applied to the active graphene. From the results, it is confirmed that the graphene light-emitting device operates as a light-emitting device. Also, referring to FIG. 11, the PL curve and the EL curve almost match each other. This means that the graphene light-emitting device according to the present embodiment has excellent photoluminescence efficiency.

The graphene light-emitting devices according to the above embodiments may be formed as a flexible device due to mechanical characteristics of graphene, and various designs may be obtainable by cutting graphene by, for example, etching.

Unlike a compound semiconductor that requires an expensive metal-Organic chemical vapour deposition (MOCVD) equipment, graphene is prepared using a conventional chemical vapour deposition (CVD) equipment, manufacturing costs and a process time may be reduced compared to a conventional compound semiconductor light-emitting device.

Figure 12:
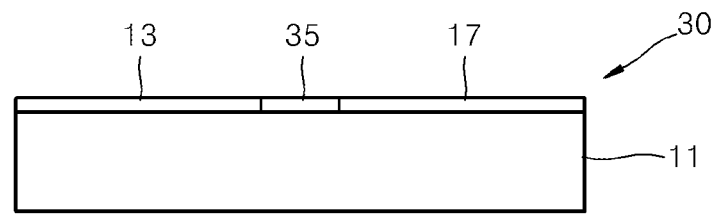
FIG. 12 is a side view of a graphene light-emitting device according to another embodiment of the present invention.
Figure 13:
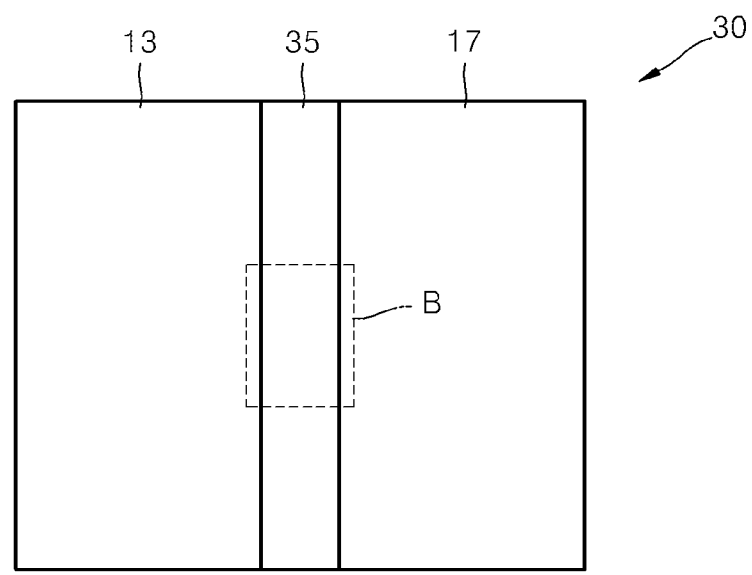
FIG. 13 is a plan view of the graphene light-emitting device of FIG. 8.
Figure 14:
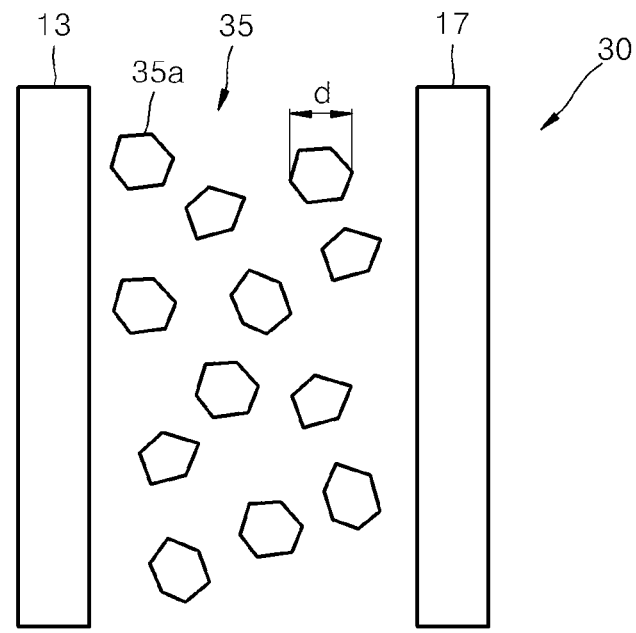
FIG. 14 is an enlarged view of a region B of FIG. 13 as an example of a graphene quantum dot of an active graphene.

FIG. 12 is a side view of a graphene light-emitting device 30 according to another embodiment of the present invention, FIG. 13 is a plan view of the graphene light-emitting device 30 of FIG. 12, and FIG. 14 is an enlarged view of a region B of FIG. 13, as an example of a graphene quantum dot of an active graphene 35.

Referring to FIGS. 12 and 13, the graphene light-emitting device 30 according to the present embodiment includes the p-type graphene 13, an active graphene 35, and the n-type graphene 17 which are flush with each other and horizontally disposed on a substrate 11. The substrate 11, the p-type graphene 13, and the n-type graphene 17 are substantially identical to the respective corresponding elements described in the previous embodiments, and thus, will not be described in detail. The active graphene 35 includes a plurality of graphene quantum dots dispersed in a region between the p-type graphene 13 and the n-type graphene 17.

FIG. 14 is an enlarged view of the region B of FIG. 13 as an example of a graphene quantum dot of the active graphene 35. Referring to FIG. 14, graphene quantum dots 35a may have substantially the same diameter d, and may be dispersed between the p-type graphene 13 and the n-type graphene 17. The sizes (that is, diameters d) of the graphene quantum dots 35a may be in a range of about 1 nm to about 100 nm. As described later, the sizes of the graphene quantum dots 35a are directly related to the photoluminescence wavelength, and larger graphene quantum dots 35a have longer photoluminescence wavelength. Accordingly, by controlling the sizes of the graphene quantum dots 35a to be substantially identical, the graphene light-emitting device 30 has a monocolor photoluminescence characteristic. Also, by appropriately selecting the sizes of the graphene quantum dots 35a, the wavelength range corresponding to light emitted by the graphene light-emitting device 30 may be determined. In the case of a light-emitting diode using a conventional compound semiconductor, the photoluminescence wavelength is controlled by changing the composition of a compound semiconductor. However, in the case of the light-emitting device 30 according to the present embodiment, the photoluminescence wavelength may be easily controlled by changing the sizes of the graphene quantum dots 35a formed of the same material.

Also, a functional group may be attached to the graphene quantum dots 35a to functionalize the graphene quantum dots 35a. As described below, when a functional group is attached to the graphene quantum dots 35a, doping characteristics or a band gap is changed. Accordingly, by doing so, photoluminescence wavelength or photoluminescence characteristics (full width at half maximum) of the graphene light-emitting device 30 may be controllable.

Then, an operation of the graphene light-emitting device 30 will now be described in detail. When a voltage is applied to the p-type graphene 13 and the n-type graphene 17 in a forward direction, holes in the p-type graphene 13 and electrons in the n-type graphene 17 move toward the active graphene 35. As described above, the p-type graphene 13 and the n-type graphene 17 each have an energy band gap by doping with a corresponding dopant. Accordingly, the electrons and holes injected into the active graphene 35 are recombined with each other in the active graphene 35, thereby emitting a photon, that is, light corresponding to the energy band gap. In this case, photoluminescence caused by the graphene quantum dots 35a of the active graphene 35 may result in amplifying light generated due to the recombination of the holes and the electrons, thereby increasing the recombination efficiency of the holes and electrons. Also, because graphene has very high carrier mobility, a high level of current may be suppliable to induce high brightness emission.

Referring to FIG. 14, the graphene quantum dots 35a have substantially the same diameter d. However, the structure of the graphene quantum dots 35a is not be limited thereto. For example, the graphene quantum dots 35a may have different sizes.

Figure 15:
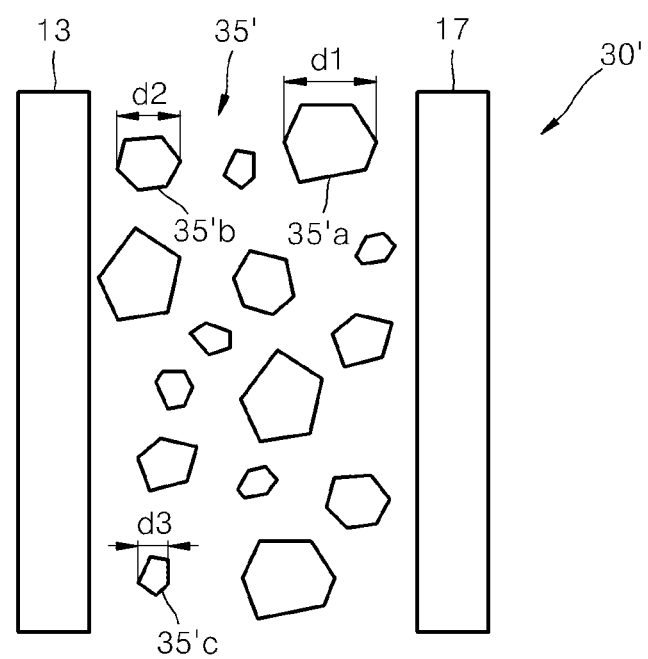
FIG. 15 illustrates another example of the graphene quantum dot of the active graphene.

FIG. 15 is an enlarged view of the region B of FIG. 13, as another example of the graphene quantum dots of the active graphene 35'. Referring to FIG. 15, the graphene quantum dots 35'a, 35'b, and 35'c may have different diameters d1, d2, and d3. Because larger graphene quantum dots 35'a, 35'b, and 35'c have longer photoluminescence wavelength, by appropriately controlling the diameters d1, d2, and d3 of the graphene quantum dots 35'a, 35'b, and 35'c, the graphene quantum dots 35'a, 35'b, and 35'c may respectively have red, green, and blue photoluminescence characteristics, thereby allowing the graphene light-emitting device 30' to function as a white light source.

In this case, the photoluminescence wavelength or photoluminescence characteristics (full width at half maximum) of the graphene light-emitting device 30 is controllable by attaching a functional group to the graphene quantum dots 35'a.

Figure 16A:
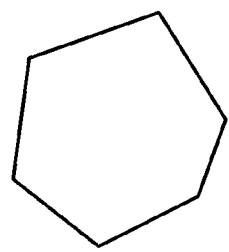
FIGS. 16A to 16C illustrate examples of the graphene quantum dot.
Figure 16B:
Figure 16C:
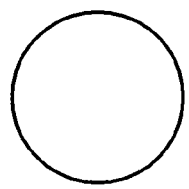

The shapes of the graphene quantum dots 35a, 35'a, 35'b, and 35'c of the active graphene 35 and 35' do not limit the embodiments of the present invention. FIGS. 16A to 16C illustrate various shapes of the graphene quantum dots 35a, 35'a, 35'b, and 35'c, and the graphene quantum dots 35a, 35'a, 35'b, and 35'c may instead have other shapes.

Figure 17:
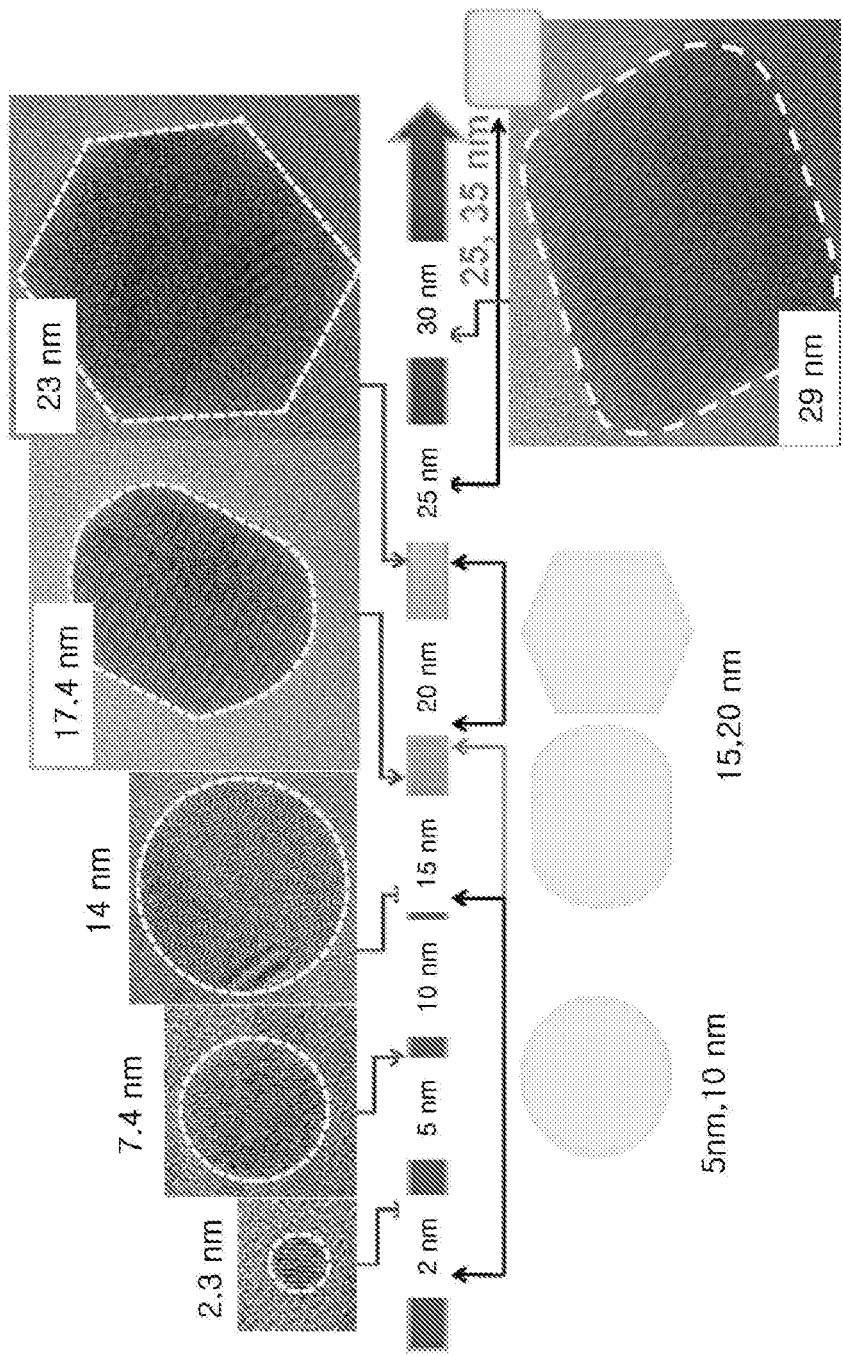
FIG. 17 shows a wavelength absorption characteristic according to the size and shape of the graphene quantum dot.

When a laser light is irradiated to a graphene quantum dot, it is known that light is amplified by excitation. The graphene quantum dot shows a maximum pi state density of 6.2 eV, and shows light absorption characteristics of 200 nm to 416 nm according to its size. FIG. 17 shows images of graphene quantum dots, from which it is confirmed that a photoluminescence wavelength varies according to size and shape. Referring to FIG. 17, for example, a circular-shaped graphene quantum dot having a size of 2.3 nm shows blue photoluminescence characteristics, a circular-shaped graphene quantum dot having a size of 7.8 nm shows bluish green photoluminescence characteristics, a circular-shaped graphene quantum dot having a size of 14 nm shows green photoluminescence characteristics, an oval-shaped graphene quantum dot having a size of 17.4 nm shows yellowish green photoluminescence characteristics, and a hexagonal-shaped graphene quantum dot having a size of 23 nm shows a reddish yellow photoluminescence characteristics. Also, a circular-shaped graphene quantum dot having a size of about 5 nm to 10 nm shows blue-based photoluminescence characteristics, an oval-shaped graphene quantum dot having a size of about 15 nm shows green-based photoluminescence characteristics, a hexagonal-shaped graphene quantum dot having a size of about 20 nm shows yellow to reddish yellow-based photoluminescence characteristics, and a rectangular-type graphene quantum dot having a size of 25 nm to 35 nm shows red-based photoluminescence characteristics. As such, because a photoluminescence wavelength varies according to the size and shape of the graphene quantum dots, a photoluminescence wavelength of a graphene light-emitting device may be determined by selecting a graphene quantum dot having an appropriate size and shape.

Then, by referring to FIGS. 18 to 20, photoluminescence characteristics according to the attachment of a functional group to graphene will now be described in detail.

A functional group may be attached to a surface or edge of graphene. Examples of the functional group are alkylamine, aniline, methylene blue, an amine-based polymer, and other known functional groups. Methods of attaching a functional group to graphene are also known.

For example, a graphene oxide that is formed by oxidizing graphene or is obtained during the graphene manufacturing process includes a plurality of carboxyl groups (COOH). Accordingly, as shown in Reaction Scheme 1 below, a carboxyl group (COOH) of the graphene oxide and an amine group ($NH_2$) of a functional group form a peptide bond by dehydration, thereby attaching the functional group to the graphene oxide. Then, the graphene oxide is reduced into graphene by using, for example, a hydrazine, thereby completing the formation of a graphene to which the functional group is attached.

[Reaction Scheme 1]

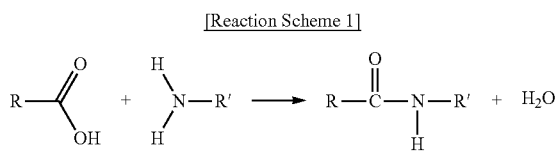

Figure 18:
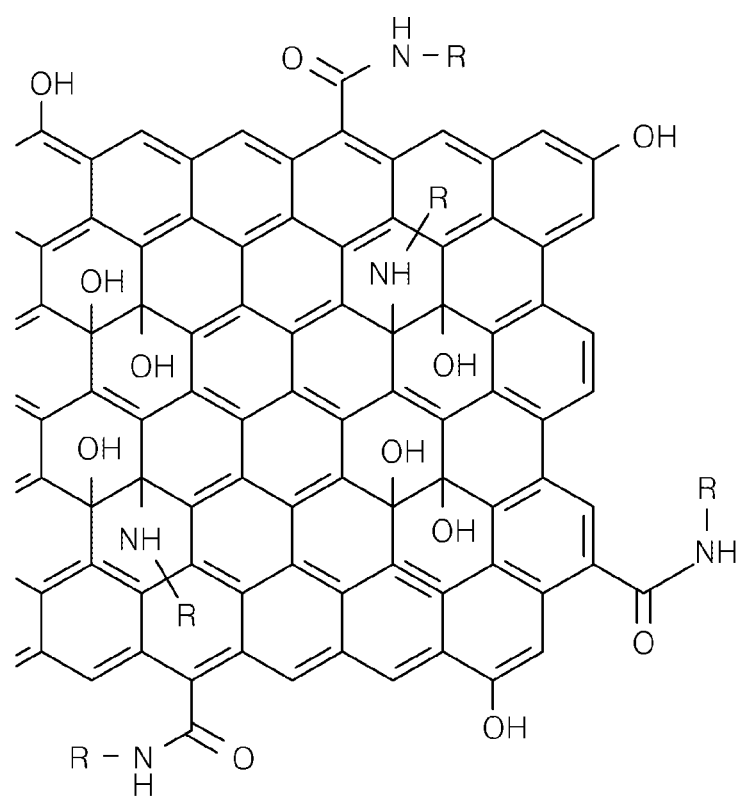
FIG. 18 shows an example of a graphene oxide to which a functional group is attached.

FIG. 18 shows a case in which alkylamine is attached to the carboxyl group of the graphene oxide via a peptide reaction. Referring to FIG. 18, alkylamine is bonded to the surface or edge of the graphene oxide.

Also, photoluminescence graphene, n-doping graphene, etc. may be formed by controlling the electrical characteristics or photoluminescence characteristics of the graphene according to the kind or attachment location of the functional group attached to graphene.

Figure 19:
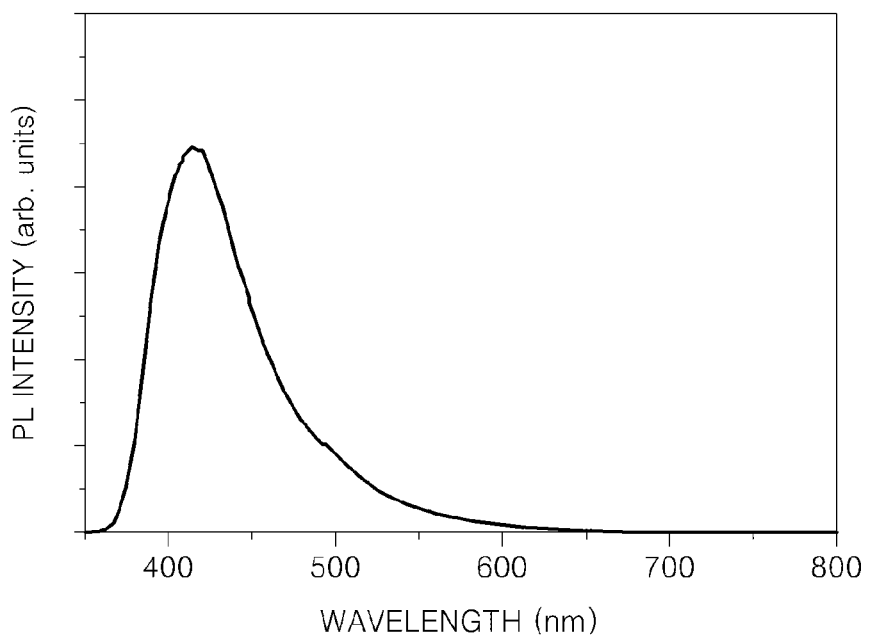
FIG. 19 shows photoluminescence characteristics of a graphene quantum dot to which aniline is attached.
Figure 20:
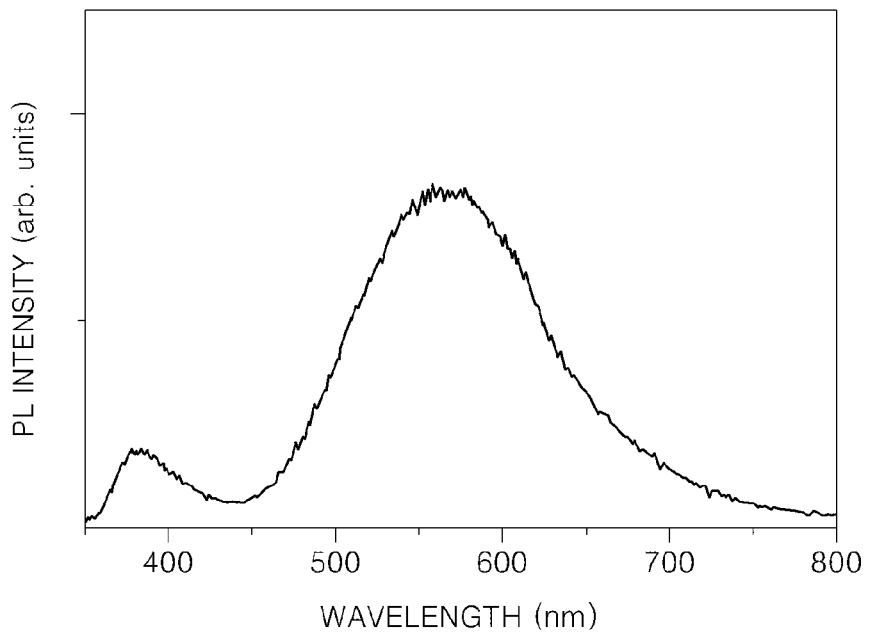
FIG. 20 shows photoluminescence characteristics of a graphene quantum dot to which polyethylene glycol (PEG) is attached.

FIG. 19 is a photoluminescence spectrum obtained by exciting a graphene quantum dot to which aniline as an aromatic amine is attached by irradiating a laser light having a wavelength of 325 nm thereto, and FIG. 20 is a photoluminescence spectrum obtained by exciting a graphene quantum dot to which polyethylene glycol (PEG) is attached by irradiating a laser light having a wavelength of 325 nm thereto. In this case, the graphene quantum dot to which aniline is attached may be prepared as follows: a graphene quantum dot is oxidized to form a graphene oxide quantum dot, and then a carboxyl group of the graphene oxide quantum dot is bonded to aniline as an aromatic amine via a peptide reaction and the resultant product is reduced. The graphene quantum dot to which PEG is attached may be prepared as follows: a carboxyl group of a graphene oxide quantum dot is bonded to an amine group of PEG as an amine-based polymer via a peptide reaction, thereby attaching the PEG to the graphene oxide quantum dot, and the resultant product is reduced. Referring to FIGS. 19 and 20, it is confirmed that according to a functional group attached to the graphene quantum dot, a photoluminescence wavelength varies, and furthermore, a full width at half maximum of photoluminescence spectrum also varies.

Figure 21A:
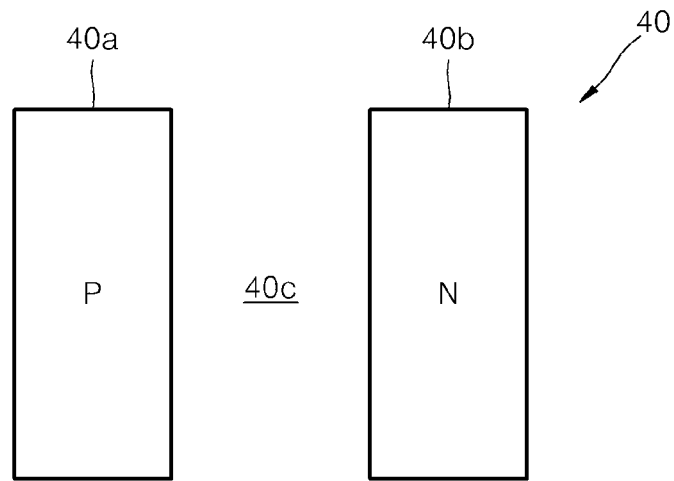
FIGS. 21A and 21B are views for explaining a method of manufacturing a graphene light-emitting device, according to another embodiment of the present invention.
Figure 21B:
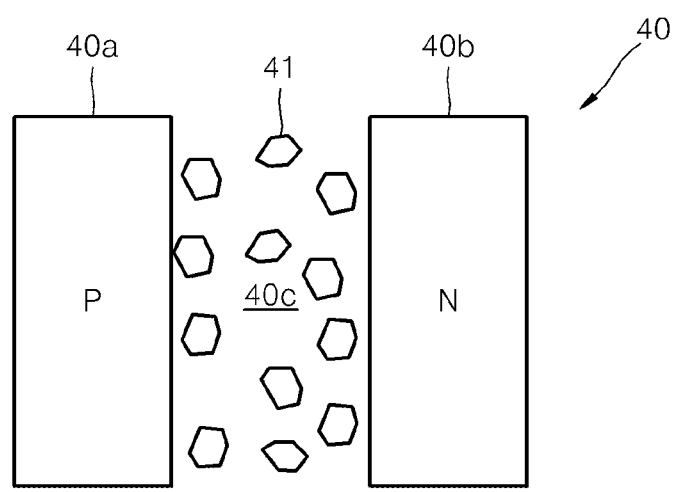

FIGS. 21A and 21B are views for explaining a method of manufacturing a graphene light-emitting device, according to another embodiment of the present invention.

Referring to FIG. 21A, a graphene sheet 40 includes a p-type doped region 40a and an n-type doped region 40b spaced apart from each other. A region 40c between the p-type doped region 40a and the n-type doped region 40b is removed. The graphene sheet 40 may be formed by removing the third region 20c instead of forming the graphene superlattice structure in the third region 20c, which has been referred in describing the method with reference to FIGS. 7A to 7D, and a related repeating description thereof will not be presented herein.

Then, referring to FIG. 21B, graphene quantum dots 41 having predetermined sizes are applied in the region 40c between the p-type doped region 40a and the n-type doped region 40b.

For example, the graphene quantum dots 41 may be formed by controlling the graphene size by cutting a reduced portion by heating and reducing a graphene oxide. For example, when graphite is oxidized and dispersed by using a modified Hummers method, a van der Walls attractive force between layers decreases and a grain size decreases, thereby forming graphene oxide. Then, a reducing process using heat, for example, a dry process or a chemical reduction process (for example, reduced graphene oxide process) is performed thereon to reduce the graphene oxide to manufacture a graphene sheet, which is then oxidized. As such, by undergoing the oxidation process, the size of graphene grain decreases and the interlayer van der Walls attractive force thereof decreases, thereby enabling ease of dispersion. The oxidized graphene sheet is reduced by heat treating in a range of 200□ for 10 hours, and dispersed by ultrasonication and dialyzed via a dialysis membrane to filter only a predetermined size of graphene. In this case, because the graphene size is in a range of a few nm to few tens nm, the prepared graphene may be equivalent to a graphene quantum dot. As described above, by oxidizing or reducing graphene or graphite twice, nano-sized graphene quantum dots 41 may be prepared.

Also, a functional group may be attachable to the graphene quantum dots 41.

For example, a process of attaching aniline to the graphene quantum dot will now be described in detail. First, as shown in Reaction Scheme 2 below, the graphene quantum dot is treated with a nitric acid to oxidize to form a graphene oxide quantum dot having a carboxyl group (COOH).

[Reaction Scheme 2]

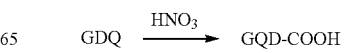

In Reaction Scheme 2, GQD denotes a graphene quantum dot.

Then, as shown in Reaction Scheme 3 blow, the graphene oxide quantum dot is subjected to a thionyl chloride reaction at a temperature of 60☐ for 24 hours. Synthesized GQD-COCl is extracted by distillation and purification.

GQD-COOH+SOCl$_2$→GQD-COCl+SO$_2$+HCl [Reaction Scheme 3]

Then, as shown in Reaction Scheme 4, an aniline reaction is continued at a temperature of 100° C. for 5 days, thereby attaching the aniline to synthesized GQD-COCl.

[Reaction Scheme 4]

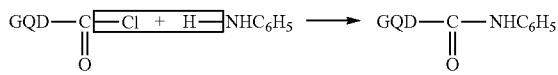

Then, aniline or salts are removed by filtering, thereby completing the preparation of a graphene oxide quantum dot to which aniline is attached. The graphene oxide quantum dot to which aniline is attached may be reduced using, for example, hydrazine, into a graphene quantum dot to which the aniline is attached.

The previously described example may also be applied to, in addition to the aniline, alkylamine having an amine group, methylene blue, or an amine-based polymer.

Figure 22:
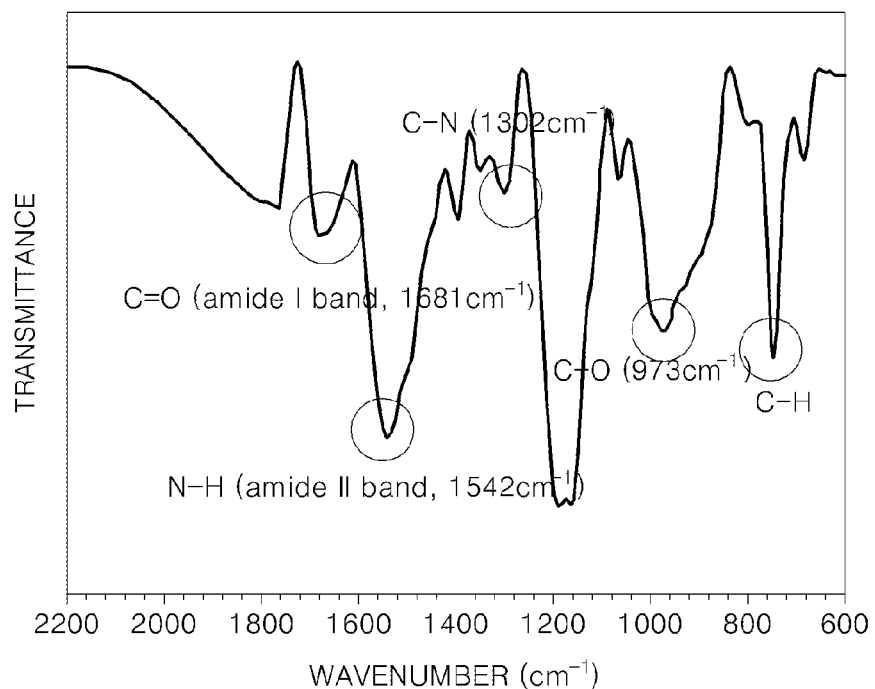
FIG. 22 shows fourier-transform infra red (FT-IR) characteristics of graphene quantum dots to which aniline is attached.

FIG. 22 shows fourier-transform infra red (FT-IR) characteristics of graphene quantum dots to which aniline is attached, which is manufactured using the method described above. Referring to FIG. 22, it is confirmed that through unique infrared spectra of a C—N bond corresponding to a wavelength region of 1302 cm$^{-1}$, a C═O bond corresponding to a wavelength region of 1681 cm$^{-1}$, and an N—H bond corresponding to a wavelength region of 1542 cm$^{-1}$ an amine group is attached to graphene quantum dots.

Figure 23:
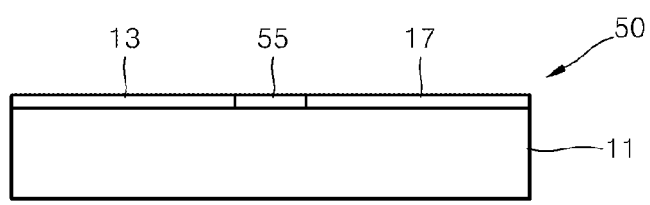
FIG. 23 is a side view of a graphene light-emitting device according to another embodiment of the present invention.
Figure 24:
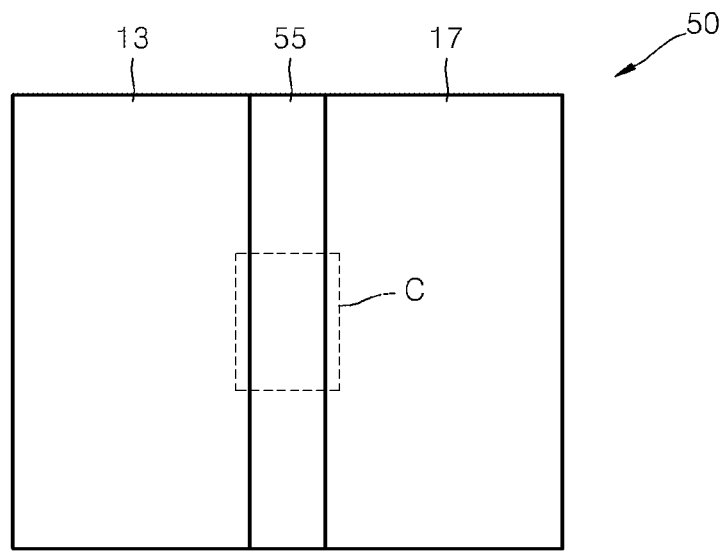
FIG. 24 is a plan view of the graphene light-emitting device of FIG. 23.
Figure 25:
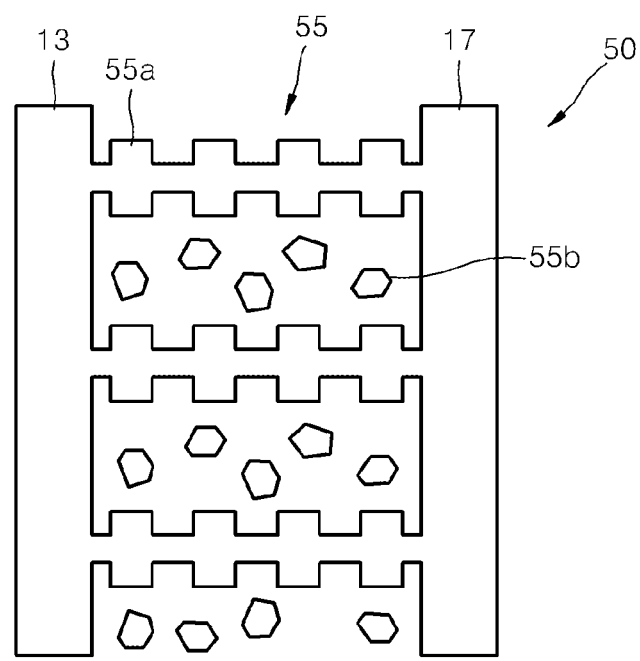
FIG. 25 is an enlarged view of a region C of FIG. 24 as an example of an active graphene.

FIG. 23 is a side view of a graphene light-emitting device 50 according to another embodiment of the present invention, FIG. 24 is a plan view of the graphene light-emitting device 50 of FIG. 23, and FIG. 25 is an enlarged view of a region C of FIG. 24 as an example of an active graphene 55.

Referring to FIGS. 23 and 24, the graphene light-emitting device 50 according to the present embodiment includes the p-type graphene 13, an active graphene 55, and the n-type graphene 17 which are flush with each other and horizontally disposed on a substrate 11. The substrate 11, the p-type graphene 13, and the n-type graphene 17 are substantially identical to the respective corresponding elements described in the previous embodiments, and thus, will not be described in detail. The active graphene 55 has a composite structure, i.e., a graphene superlattice and a graphene quantum dot in a region between the p-type graphene 13 and the n-type graphene 17.

FIG. 25 is an enlarged view of a region C of FIG. 24 as an example of the active graphene 55. Referring to FIG. 25, the active graphene 55 may include a plurality of graphene quantum dots 55b dispersed in a space between adjacent graphene superlattices 55a. That is, the graphene superlattice 55a and the graphene quantum dots 55b may be alternately arranged. In the present embodiment, the alternating direction of the graphene superlattice 55a and the graphene quantum dots 55b is perpendicular to a direction in which the p-type graphene 13 is spaced from the n-type graphene 17. However, the alternating direction of the graphene superlattice 55a and the graphene quantum dots 55b may instead be parallel to the spacing direction of the p-type graphene 13 and the n-type graphene 17

The graphene superlattice 55a may be substantially identical to the graphene superlattices of the active graphene 15, 15', 15", and 15'" which have been described with reference to FIGS. 3 to 6. The graphene quantum dots 55b may be substantially identical to the graphene quantum dots 35a, 35a', 35b', and 35c' of the active graphene 35 and 35' which have been described with reference to FIGS. 10 and 18. In the present embodiment, the photoluminescence efficiency of the active graphene 55 may be increased by combining a quantum efficiency increase due to a multiple quantum well potential of the graphene superlattice 55a and a light amplification effect of the graphene quantum dots 55b.

Figure 26:
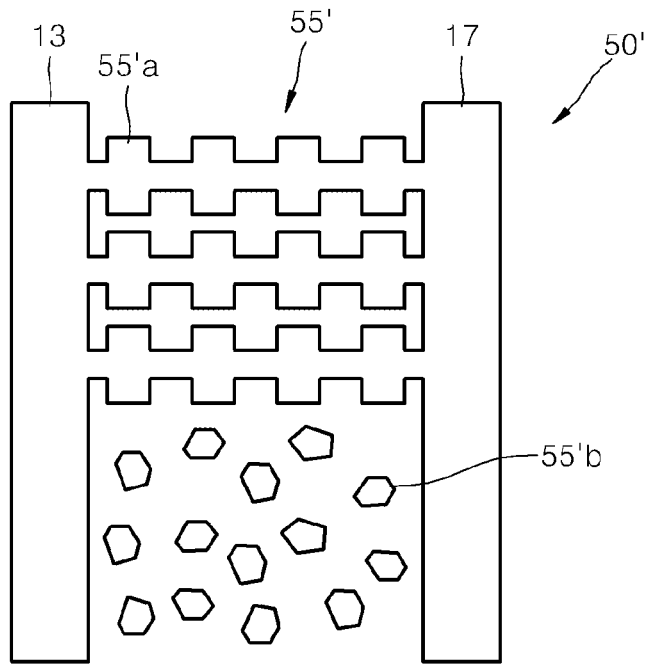
FIGS. 26 and 27 illustrate other examples of the active graphene.
Figure 27:
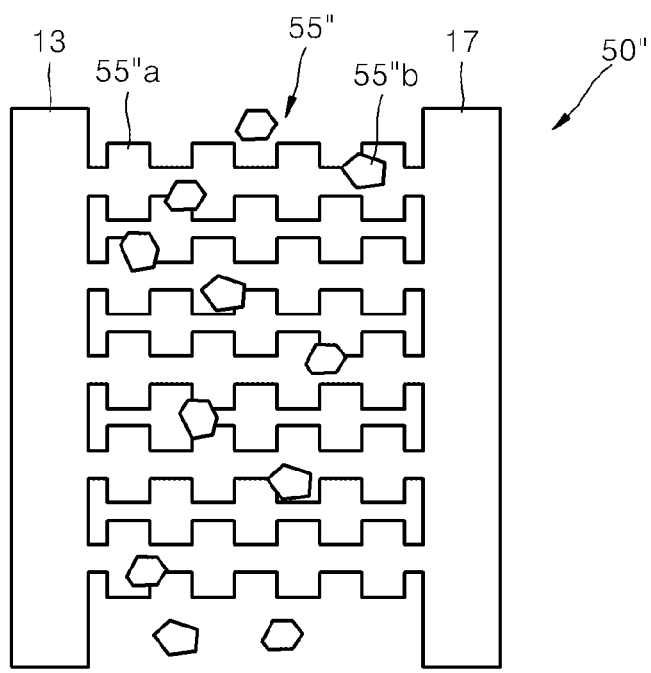

The composite structure of the active graphene 55 may have various other shapes. FIGS. 26 and 27 are enlarged images of the region C of FIG. 24, as other examples of the active graphene 55.

Referring to FIG. 26, an active graphene 55' of a graphene light-emitting device 50' includes a region in which a graphene superlattice 55'a is formed and a region in which graphene quantum dots 55'b are dispersed. Referring to FIG. 27, an active graphene 55" of a graphene light-emitting device 50" according to another embodiment of the present invention includes a graphene superlattice 55"a and a graphene quantum dots 55"b dispersed on the graphene superlattice 55"a, wherein the graphene superlattice 55"a and the graphene quantum dots 55"b overlap.

The graphene light-emitting devices according to the above embodiments may be formed as a flexible device due to mechanical characteristics of graphene, and various designs may be obtainable by cutting graphene by, for example, etching.

Unlike a compound semiconductor that requires an expensive MOCVD equipment, graphene is prepared using a conventional CVD equipment, manufacturing costs and a process time may be reduced compared to a conventional compound semiconductor light-emitting device.

The graphene light-emitting devices and methods of manufacturing the same according to the above embodiments of the present invention have been described with reference to the attached drawings. However, it should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A graphene light-emitting device comprising:
a p-type graphene doped with a p-type dopant;
an n-type graphene doped with an n-type dopant; and
an active graphene that is disposed between the p-type graphene and the n-type graphene and emits light,
wherein the p-type graphene, the n-type graphene, and the active graphene are horizontally disposed, and
wherein the active graphene comprises a graphene superlattice.

2. The graphene light-emitting device of claim 1, wherein the graphene superlattice has a multiple quantum well potential.

3. The graphene light-emitting device of claim 1, wherein the graphene superlattice comprises at least one graphene nanoribbon having a band shape connecting the p-type graphene to the n-type graphene.

4. The graphene light-emitting device of claim 3, wherein at least one of opposite edges of the at least one graphene nanoribbon has a zigzag shape.

5. The graphene light-emitting device of claim 4, wherein a width of each of the at least one graphene nanoribbon periodically changes within a range of about 3 nm to about 20 nm.

6. The graphene light-emitting device of claim 3, wherein an interval between adjacent graphene nanoribbons of the at least one graphene nanoribbon is in a range of about 2 nm to about 19 nm.

7. The graphene light-emitting device of claim 1, wherein the graphene superlattice comprises at least one graphene nanoribbon that extends parallel to boundaries of the p-type graphene and the n-type graphene between the p-type graphene and the n-type graphene.

8. The graphene light-emitting device of claim 7, wherein at least one of opposite edges of the at least one graphene nanoribbon has a zigzag shape.

9. The graphene light-emitting device of claim 1, wherein the graphene superlattice has periodically arranged quantum dot patterns.

10. The graphene light-emitting device of claim 1, wherein the active graphene further comprises a plurality of graphene quantum dots dispersed between the p-type graphene and the n-type graphene.

11. The graphene light-emitting device of claim 10, wherein a first region in which the graphene superlattice is disposed and a second region in which a plurality of graphene quantum dots are disposed do not overlap.

12. The graphene light-emitting device of claim 10, wherein a first region in which the graphene superlattice is disposed and a second region in which a plurality of graphene quantum dots are alternately arranged.

13. The graphene light-emitting device of claim 10, wherein a first region in which the graphene superlattice is disposed and a second region in which a plurality of graphene quantum dots are disposed overlap.

14. The graphene light-emitting device of claim 1, wherein the active graphene comprises a plurality of graphene quantum dots dispersed between the p-type graphene and the n-type graphene.

15. The graphene light-emitting device of claim 10, wherein the graphene quantum dots have substantially the same size.

16. The graphene light-emitting device of claim 10, wherein the graphene quantum dots have at least two different sizes.

17. The graphene light-emitting device of claim 16, wherein the graphene quantum dots comprise three different sizes respectively corresponding to a red photoluminescence, a green photoluminescence, and a blue photoluminescence.

18. The graphene light-emitting device of claim 14, wherein the graphene quantum dots have substantially the same shape.

19. The graphene light-emitting device of claim 14, wherein the graphene quantum dots have at least two different shapes.

20. The graphene light-emitting device of claim 1, wherein the active graphene is a graphene that is functionalized by attaching a functional group to a surface or edge of the graphene.

21. A graphene light-emitting device comprising:
a p-type graphene doped with a p-type dopant;
an n-type graphene doped with an n-type dopant; and
an active graphene that is disposed between the p-type graphene and the n-type graphene and emits light,
wherein the p-type graphene, the n-type graphene, and the active graphene are horizontally disposed,
wherein the active graphene is a graphene that is functionalized by attaching a functional group to a surface or edge of the graphene, and
wherein the functional group is alkylamine, aniline, methylene blue, or an amine-based polymer.

22. The graphene light-emitting device of claim 1, wherein the p-type graphene, the n-type graphene, and the active graphene are supported by a substrate.

23. The graphene light-emitting device of claim 1, wherein the p-type dopant is at least one element selected from the group consisting of oxygen (O), gold (Au), and bismuth (Bi); at least one compound selected from the group consisting of $CH_3NO_2$, $HNO_3$, $HAuCl_4$, $H_2SO_4$, HCl, and $AuCl_3$; or a mixture thereof.

24. The graphene light-emitting device of claim 1, wherein the n-type dopant is at least one element selected from the group consisting of nitrogen (N), fluorine (F), and manganese (Mn); $NH_3$; or a mixture thereof.

25. The graphene light-emitting device of claim 1, wherein the p-type graphene is horizontally spaced from the n-type graphene.

\* \* \* \* \*